United States Patent [19]

Kawamoto et al.

[11] 3,926,693

[45] Dec. 16, 1975

[54] METHOD OF MAKING A DOUBLE DIFFUSED TRAPATT DIODE

[75] Inventors: Hirohisa Kawamoto, Kendall Park; Hans John Prager, Belle Mead; John Joseph Risko, Cranbury, all of N.J.

[73] Assignee: RCA Corporation, New York, N.Y.

[22] Filed: Apr. 29, 1974

[21] Appl. No.: 464,765

[52] U.S. Cl. ................ 148/175; 148/186; 148/188; 148/189; 148/190; 331/107; 357/13; 357/89; 357/90

[51] Int. Cl.[2] ............ H01L 21/20; H01L 21/225; H01L 29/90

[58] Field of Search .................... 148/175, 188–190, 148/186; 357/13, 89, 90; 331/107

[56] References Cited

UNITED STATES PATENTS

| | | | |
|---|---|---|---|
| 3,270,293 | 8/1966 | Deloach et al. | 357/13 |
| 3,462,311 | 8/1969 | Ross | 148/175 UX |
| 3,493,443 | 2/1970 | Cohen | 148/175 |
| 3,600,649 | 8/1971 | Liu et al. | 148/175 X |
| 3,628,185 | 12/1971 | Evans et al. | 331/107 R |
| 3,743,967 | 7/1973 | Fitzsimmons et al. | 331/107 R |

OTHER PUBLICATIONS

Sze et al., "Microwave Avalanche Diodes" Proc. IEEE, Vol. 59, No. 8, Aug. 1971, p. 1140–1154.

Seidel et al., "Double-Drift-Region . . . . . Impatt Diodes" Ibid, Vol. 59, No. 8, Aug. 1971, p. 1222–1228.

Watts et al., "Double Drift...Impatt Diode...by Epitaxial Growth" Electronics Letters, Vol. 9, No. 8/9, 3rd May 1973, p. 183–184.

*Primary Examiner*—C. Lovell
*Assistant Examiner*—W. G. Saba
*Attorney, Agent, or Firm*—Edward J. Norton; Joseph D. Lazar; Michael A. Lechter

[57] ABSTRACT

A Trappatt diode having four conducting regions. The diode includes an n-type region contiguous to a p-type region, forming a P-N junction therebetween. Contiguous to the n-type region is a first outer conductivity region. The first outer conductivity region is of the same conductivity type as the n-type region but of a higher doping concentration. Contiguous to the p-type region is a second outer conductivity region. The second outer conductivity region is of the same conductivity type as the p-type region but of higher doping concentration. The p-type region and the n-type region are the active regions of the Trapatt diode and have a graded doping concentration. In addition, the active regions are in close proximity to a surface of the diode which is generally mounted in contact with a heat sink. The graded doping concentration and close proximity of the active regions to a heat sink results in a Trapatt diode with good thermal dissipation characteristics, increased power output, and a broader bandwidth.

5 Claims, 4 Drawing Figures

METHOD OF MAKING A DOUBLE DIFFUSED TRAPATT DIODE

BACKGROUND OF THE INVENTION

The invention herein disclosed was made in the course of or under a contract or subcontract thereunder with the Department of the Air Force.

This invention relates to a double diffused Trapatt diode and more specifically to a Trapatt diode with both shallow diffusion and a graded P-N junction.

A Trapatt diode is an avalanche diode which operates in the Trapatt mode, which is an abbreviation for TRApped Plasma Avalanche Triggered Transit mode. In a Trapatt diode under certain conditions the avalanche that starts at the high field point of the depletion region, sweeps rapidly across the device, leaving the depletion region filled with a highly conducting plasma of electrons and holes. The space charge of the plasma depresses the electric field and the voltage to very low values. In the absence of high electric fields, the charge carriers cannot rapidly escape; hence the name of this mode of operation.

In the past, deep diffusion of a source dopant was used to fabricate a Trapatt diode with a graded junction. However, this deep diffusion caused poor thermal resistances and poor thermal dissipation capabilities in the Trapatt diode. Shallow diffusion of the source dopant resulted in better thermal dissipation capabilities, but an abrupt junction rather than a graded junction is formed.

A Trapatt diode with a graded junction has the advantages over an abrupt junction diode of possessing greater output power capabilities, broader bandwidths and achieving higher output frequencies and better efficiency. For a Trapatt diode to operate for a long pulsewidth without burning out, requires good thermal dissipation capabilities.

A Trapatt diode that has both the heat dissipation capabilities of shallow diffusion and the improved RF operating characteristics resulting from a graded junction would be desirable.

SUMMARY OF THE INVENTION

A Trapatt diode including a body of semiconductor material having opposed surfaces. The body of semiconductor material has two inner contiguous conductivity regions of opposite conductivity type forming a P-N junction therebetween. A first outer conductivity region is contiguous to one of the inner regions and extends to one of the body surfaces. Contiguous to the other inner region is a second outer conductivity region which extends to the other body surface. The outer regions are of the same conductivity as their contiguous inner region but are of a higher doping concentration. The doping concentration in each of the inner regions increases from zero at the P-N junction to its respective contiguous outer region.

The first outer region has a doping concentration which increases rapidly from the contiguous inner region to the one surface of the body. The second outer region has a uniform doping concentration.

DETAILED DESCRIPTION

Figure 1:
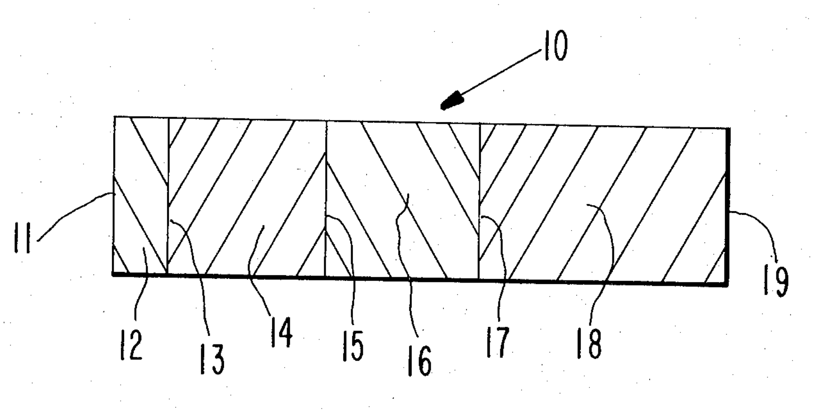
FIG. 1 is a cross-sectional view of the double diffused Trapatt diode of the present invention.

Referring to FIG. 1, the double diffused Trapatt diode is designated as 10. The double diffused Trappat diode 10 comprises a body of single crystal semiconductor material, such as silicon, having a heat dissipation surface 11, and opposed surface 19. The body includes four conductivity regions, which are outer n-type region 12, inner n-type region 14, inner p-type region 16 and outer p-type region 18.

The outer n-type region 12 has a high concentration of n-type dopant so as to be of $n^+$ conductivity. The outer n-type region 12 is contiguous to the inner n-type region 14 at a boundary 13, and extends to the heat dissipation surface 11. A P-N junction 15 is formed between inner n-type region 14 and the inner p-type region 16. The outer p-type region 18 is contiguous to the inner p-type region 16, forming a boundary 17 therebetween, and extends to the opposed surface 19. The outer p-type region 18 has a high concentration of p-type dopant so as to be of $p^+$ conductivity.

The outer n-type region 12 and the outer p-type region 18 both function as ohmic contacts. The inner n-type region 14 and the inner p-type region 16 are the active regions of the Trapatt diode 10.

Figure 2:
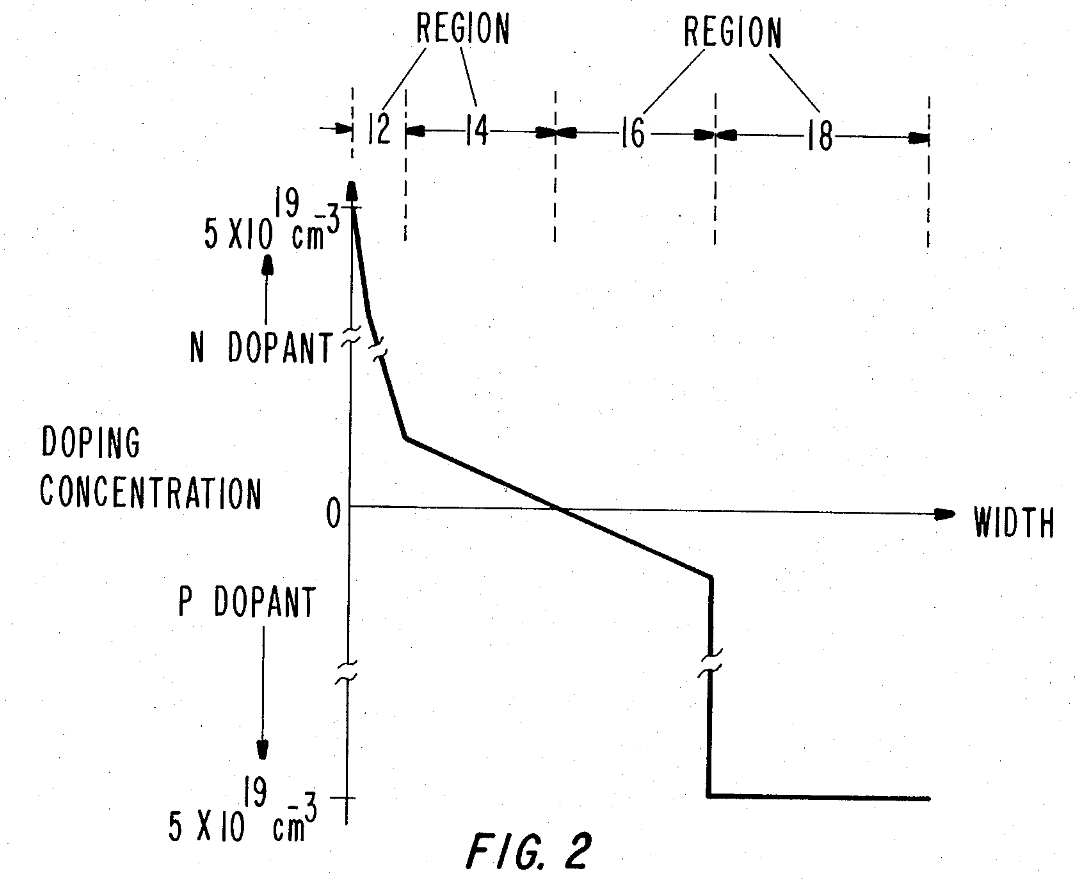
FIG. 2 is a graph of the doping profile of the double diffused Trapatt diode of the present invention.

The doping profile of the Trapatt diode 10 is shown in FIG. 2. Outer p-type region 18 has a high doping concentration, on the order of $5 \times 10^{19}cm^{-3}$, which is uniform throughout the outer p-type region 18. The outer n-type region 12 is a thin region, on the order of 2 to 3 microns thick. At heat dissipation surface 11, the outer n-type region 12 has a high doping concentration, on the order of $5 \times 10^{19}cm^{-3}$, but the doping concentration decreases rapidly toward boundary 13.

The n-type region 14 and inner p-type region 16 have graded doping concentrations. At the P-N junction 15, the n-type doping compensates the p-type doping, thus the effective doping is zero. The inner n-type region 14 has its highest n-type doping concentration at boundary 13 and thereafter decreases to zero at the P-N junction 15. The inner p-type region 16 has its highest p-type doping concentration at the boundary 17 which decreases to zero at the P-N junction 15.

As is known in the art, the optimum depletion region width for a graded junction Trapatt diode is wider than the depletion layer width of an abrupt junction Trapatt diode, at a given frequency. A depletion region is a region in a semiconductor in which the mobile carrier charge density is depleted and only the fixed donor and acceptor ions remain. The capacitance of a diode is inversely proportional to the width of the depletion region. Basically, as the capacitance of a Trapatt diode decreases, the impedance of the diode increases, as indicated by the following formula:

$$Z = \frac{1}{jwC}$$

where Z is impedance, w is frequency, and C is the capacitance, and j is the square root of minus one. Therefore, the graded junction having a decreased capacitance will result in better impedance matching of the Trapatt diode 10 to an amplification or oscillation circuit, especially at higher operating frequencies. With an improved impedance match, the Trapatt diode 10 will give optimum power output. In addition, the larger depletion region width and better impedance matching of the Trapatt diode 10 are more favorable for broad bandwidth operation of a Trapatt diode amplifier. Thus, increased power output and broader bandwidth are the result of the graded doping concentration in the active region of Trapatt diode 10.

The heat produced by the operation of Trapatt diode 10 originates mainly in the active regions, which are inner n-type region 14 and inner p-type region 16. In order to improve the thermal dissipation capabilities of the Trapatt diode 10, the inner n-type region 14 and inner p-type region 16 must be located as close as possible to heat dissipation surface 11. The heat dissipation surface 11 is in intimate contact with a heat sink or any other standard device (not shown) for the dissipation of heat generated by the diode 10. Therefore, a thin outer n-type region 12 results in the close proximity of the inner n-type region 14 and inner p-type region 16 to heat dissipation surface 11, and superior thermal dissipation capabilities of Trapatt diode 10.

Figures 3A, 3B:
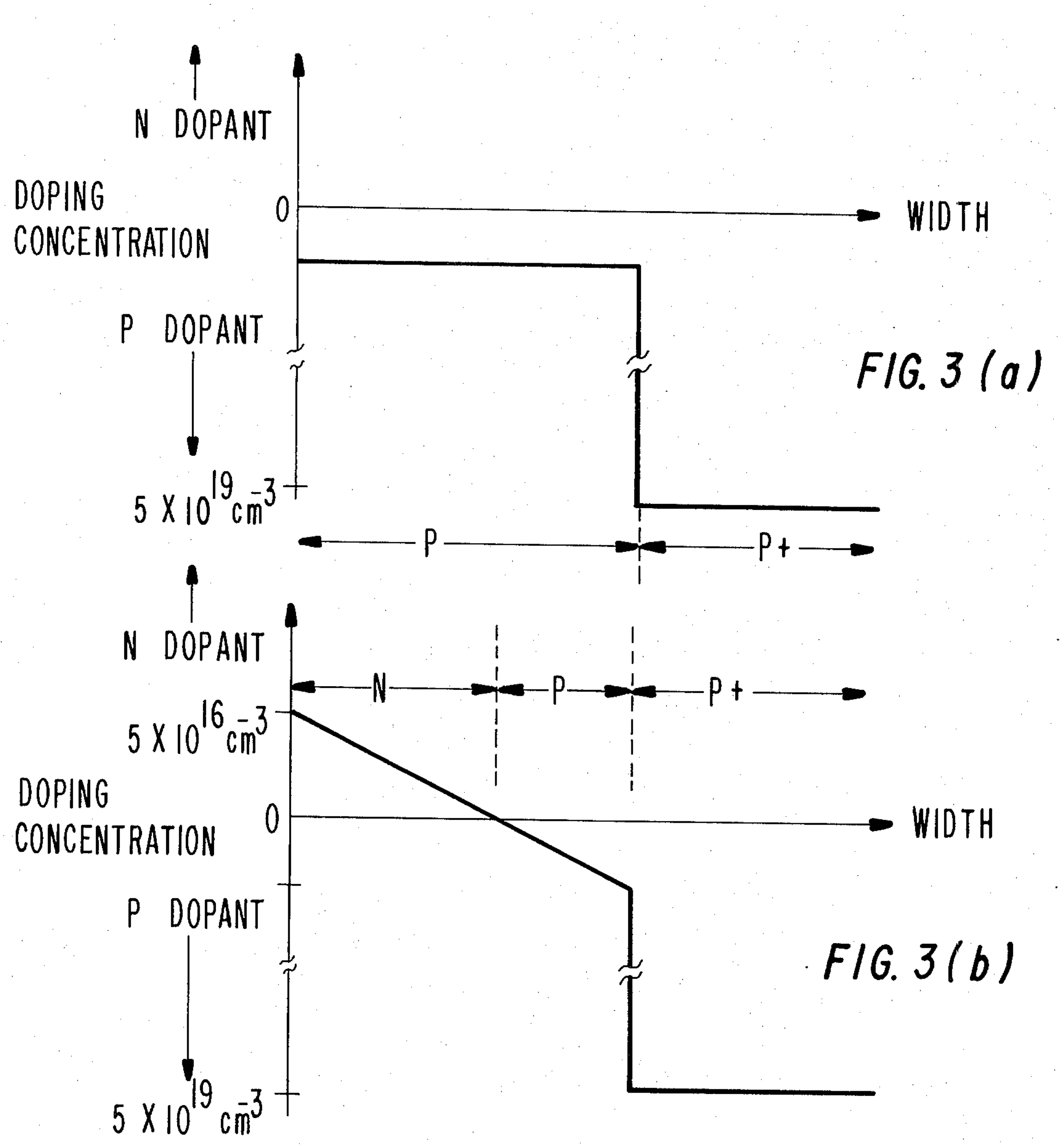
FIGS. 3*a* and 3*b* are graphs of the doping profile of the double diffused Trapatt diode at stages in its fabrication.

The fabrication of the Trapatt diode 10 begins with a $p^+$ semiconductor substrate, shown as outer p-type region 18 in the Trapatt diode 10. The doping concentration of the $p^+$ semiconductor substrate is $5 \times 10^{19}cm^{-3}$ and the dopant is typically boron. A region of p conductivity material is then epitaxially grown on the $p^+$ substrate, forming a single crystal semiconductor body. The doping profile at this time in fabrication is shown in FIG. 3(*a*), where both the p-type conductivity region and $p^+$ substrate have their respective uniform doping concentrations. This p-type conductivity region will become regions 12, 14 and 16 of the Trapatt diode 10, after a double diffusion process.

In the first diffusion, a thin layer of n-type dopant, of a concentration of $5 \times 10^{16}cm^{-3}$, is deposited on the surface of the p-type conductivity region by either liquid or vapor deposition. The n-type dopant is typically phosphorus. The wafer is then placed in a diffusion furnace for 5 to 8 hours at a temperature of about 1150°C. The diffusion of the phosphorus dopant and the outdiffusion of the boron dopant from the $p^+$ substrate results in a graded junction and an n-type conductivity region as illustrated in FIG. 3(*b*).

After the first diffusion, any n-type dopant remaining on the surface is cleaned off, and an additional n-type dopant with a concentration of $5 \times 10^{19}cm^{-3}$, is deposited by either liquid or vapor deposition on the surface. Again, the semiconductor body is placed in a diffusion furnace at a temperature of about 1150°C., but only for about 1 to 8 minutes. This second diffusion is a shallow diffusion forming the thin outer n-type region 12, with a rapidly decreasing doping profile and a peak doping concentration of $5 \times 10^{19}cm^{-3}$. After the second diffusion, Trapatt diode 10 of the present invention is formed, with a doping profile as shown in FIG. 2.

While in the preceding method of fabricating the Trapatt diode 10 the substrate 16 was a $p^+$ type, the same method of fabrication can be done by using a substrate of $n^+$ type, epitaxially growing an n-type region and using p-type dopant.

As a result of a double diffusion process, the Trapatt diode 10 is fabricated with a graded junction close to the surface where generated heat is dissipated, which accounts for the diode 10 simultaneously having a high peak power, broad bandwidth, and good thermal capabilities. The Trapatt diode 10 has excellent operating characteristics for devices, such as used in a phased array radar system.

We claim:

1. A method of fabricating a TRAPATT diode from a substrate having high dopant concentration of a given conductivity type comprising the steps of:

a. epitaxially growing on said substrate an epitaxial region of the same conductivity type as said substrate but of lower doping concentration than the doping concentration of said substrate, said epitaxial region having a surface opposed to said substrate;

b. depositing on said opposed surface a dopant of the opposite conductivity type as said substrate, and of lower doping concentration than the dopant concentration of said substrate, c. diffusing said opposite conductivity type dopant into said epitaxial region such that a portion of said epitaxial region contiguous to said opposed surface forms a region of said opposite conductivity type and such that said high dopant in said substrate diffuses into the remaining portion of said epitaxial region, to thereby form in said epitaxial region a P-N junction, and a graded doping concentration, having a predetermined gradient, extending through said junction;

d. depositing a further dopant of said opposite conductivity type on said opposed surface, said further dopant having a higher concentration than said firstmentioned dopant of said opposite conductivity type;

e. diffusing said further dopant into said opposite conductivity type region, such that a portion of said opposite conductivity type region contiguous to said opposed surface forms a heavily doped region of said opposite conductivity type, said heavily doped region having a doping concentration decreasing from said opposed surface with a gradient steeper than said predetermined gradient.

2. The method set forth in claim 1, wherein said semiconductor material is silicon and the dopant of the first-recited deposition step is phosphorous of a doping concentration of $5 \times 10^{16}$ $cm^{-3}$.

3. The method set forth in claim 2 wherein said further dopant material of the second-recited deposition step is phosphorous of a doping concentration of $5 \times 10^{19}$ $cm^{-3}$.

4. The method set forth in claim 3 wherein the first-recited diffusion step is in a diffusion furnace for 5 to 8 hours at a temperature of about 1150°C.

5. The method set forth in claim 4 wherein the second-recited diffusion step of said higher concentration dopant is in a diffusion furnace for about 1 to 8 minutes at a temperature of about 1150°C.

* * * * *